United States Patent
Matsuda et al.

(10) Patent No.: US 11,742,228 B2
(45) Date of Patent: Aug. 29, 2023

(54) SUBSTRATE PROCESSING METHOD AND SUBSTRATE PROCESSING SYSTEM

(71) Applicant: Tokyo Electron Limited, Tokyo (JP)

(72) Inventors: Risako Matsuda, Miyagi (JP); Shinobu Kinoshita, Miyagi (JP); Manabu Oie, Miyagi (JP); Keita Shouji, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 182 days.

(21) Appl. No.: 17/189,691

(22) Filed: Mar. 2, 2021

(65) Prior Publication Data

US 2021/0287922 A1 Sep. 16, 2021

(30) Foreign Application Priority Data

Mar. 11, 2020 (JP) .................................. 2020-041539

(51) Int. Cl.
*H01L 21/67* (2006.01)
*H01L 21/02* (2006.01)
*H01L 21/3065* (2006.01)
*H01L 21/66* (2006.01)

(52) U.S. Cl.
CPC .... *H01L 21/67253* (2013.01); *H01L 21/0262* (2013.01); *H01L 21/3065* (2013.01); *H01L 22/10* (2013.01)

(58) Field of Classification Search
CPC ........... H01L 21/67253; H01L 21/0262; H01L 21/3065; H01L 22/10; H01L 21/67109; H01L 21/6831; H01L 21/67017; H01L 21/0201; H01L 21/67069; H01J 37/32449; H01J 37/32816; H01J 37/32926; C23C 16/45525; C23C 16/45557; C23C 16/52
See application file for complete search history.

(56) References Cited

U.S. PATENT DOCUMENTS

| | | | |
|---|---|---|---|
| 2021/0287922 A1* | 9/2021 | Matsuda | H01L 21/67109 |
| 2021/0301942 A1* | 9/2021 | Matsuda | H01J 37/32935 |

FOREIGN PATENT DOCUMENTS

JP 2012-032983 A 2/2012

* cited by examiner

*Primary Examiner* — Jack S Chen
(74) *Attorney, Agent, or Firm* — Nath, Goldberg & Meyer; Jerald L. Meyer; Tanya E. Harkins

(57) ABSTRACT

A substrate processing method of processing a substrate using a gas supplied to a chamber includes: (a) setting a threshold value of a pressure of the gas, which is a control target in a flow rate controller configured to measure the pressure of the gas supplied to the chamber and control a flow rate of the gas; (b) supplying the gas into the chamber; (c) measuring the pressure of the gas by the flow rate controller; (d) stopping the supply of the gas into of the chamber; (e) calculating a time when the pressure of the gas measured in (c) becomes equal to or higher than the threshold value; and (f) calculating a total flow rate of the gas supplied into the chamber based on the pressure of the gas measured in (c) and the time calculated in (e).

16 Claims, 5 Drawing Sheets

--- Gas Flow ---- Gas P1 Press —Gas Set Flow

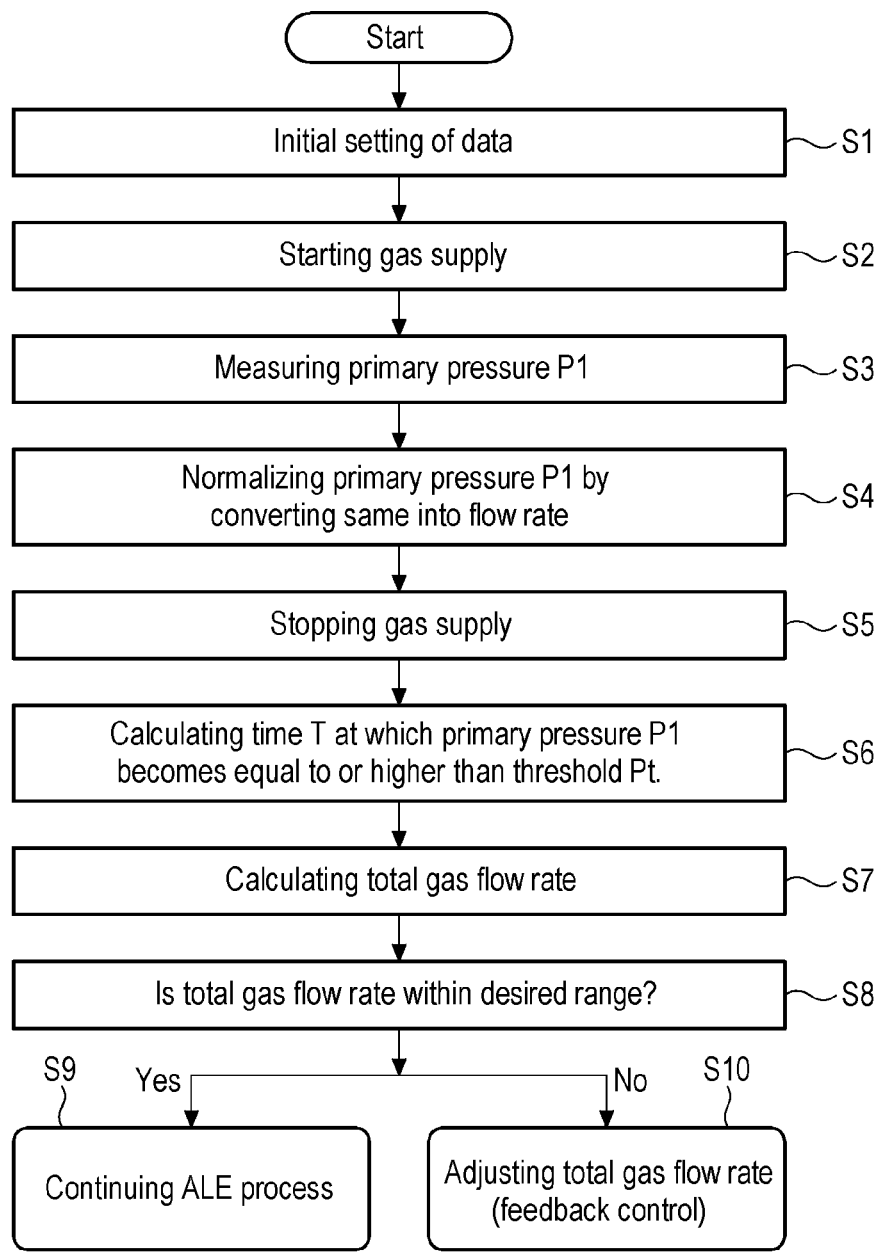

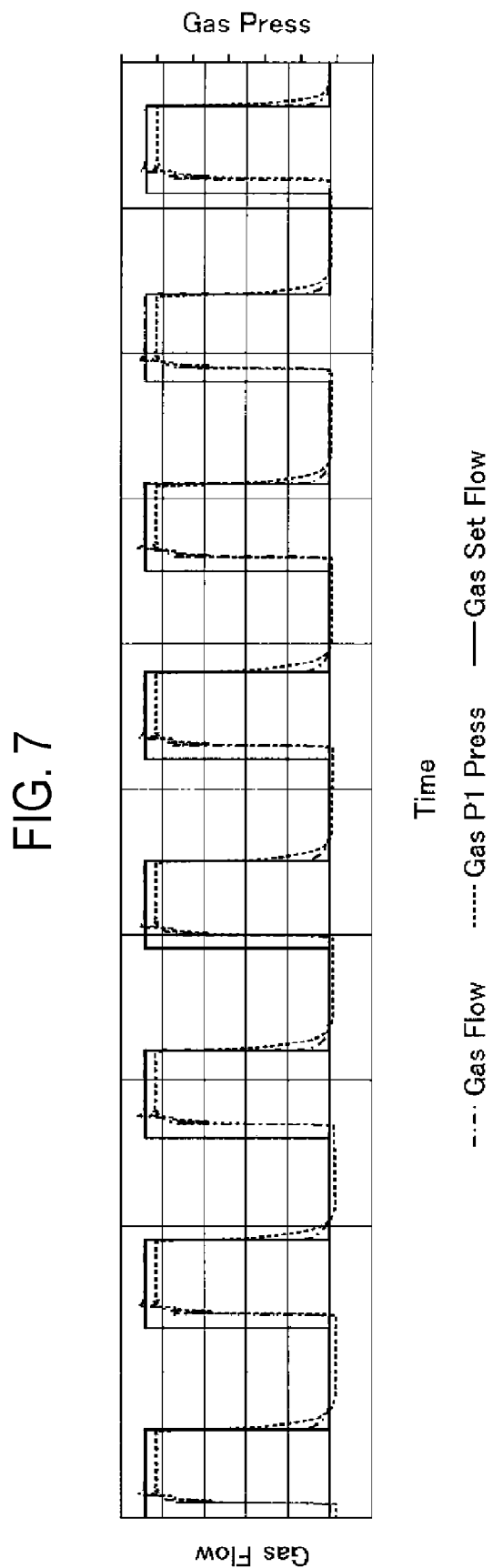

SUBSTRATE PROCESSING METHOD AND SUBSTRATE PROCESSING SYSTEM

CROSS-REFERENCE TO RELATED APPLICATION

This application is based upon and claims the benefit of priority from Japanese Patent Application No. 2020-041539, filed on Mar. 11, 2020, the entire contents of which are incorporated herein by reference.

TECHNICAL FIELD

The present disclosure relates to a substrate processing method and a substrate processing apparatus.

BACKGROUND

Patent Document 1 discloses a flow rate measurement method of a flow rate controller, which controls a flow rate of a gas, in a gas supply device used in a semiconductor manufacturing apparatus. A build-up method is used as a method of measuring the flow rate of the gas.

PRIOR ART DOCUMENT

Patent Document

Patent Document 1: Japanese laid-open publication No. 2012-32983

SUMMARY

An aspect of the present disclosure provides a substrate processing method of processing a substrate using a gas supplied to a chamber. The method includes: (a) setting a threshold value of a pressure of the gas, which is a control target in a flow rate controller configured to measure the pressure of the gas supplied to the chamber and control a flow rate of the gas; (b) supplying the gas into the chamber; (c) measuring the pressure of the gas by the flow rate controller; (d) stopping the supply of the gas into the chamber; (e) calculating a time when the pressure of the gas measured in (c) becomes equal to or higher than the threshold value; and (f) calculating a total flow rate of the gas supplied into the chamber based on the pressure of the gas measured in (c) and the time calculated in (e).

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a flowchart illustrating exemplary main processes of a method of monitoring a processing gas.

FIG. 7 is an explanatory view illustrating a state in which ON and OFF of a processing gas is repeated.

DETAILED DESCRIPTION

Figure 1:
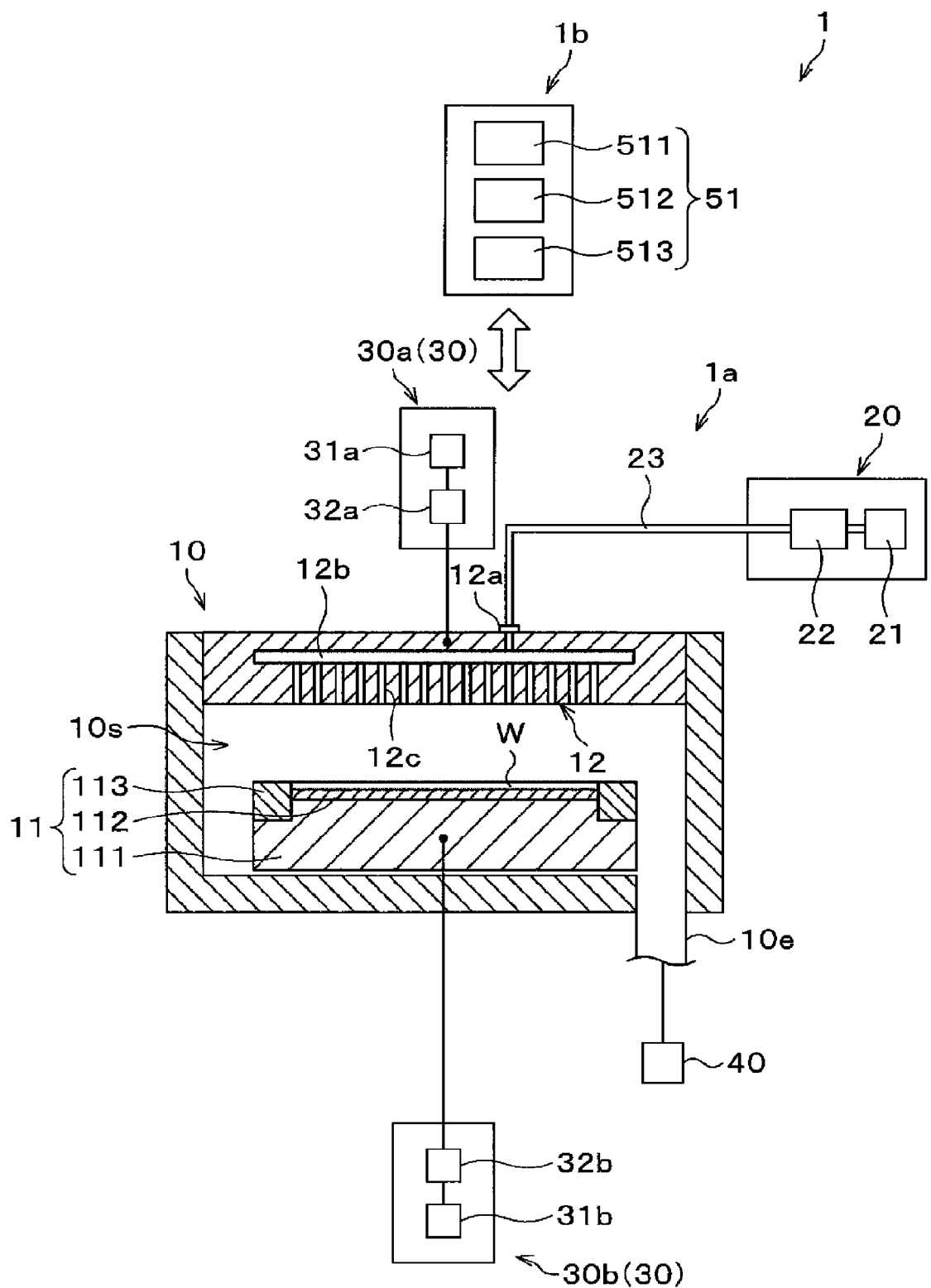
FIG. 1 is an explanatory view schematically illustrating a configuration of a plasma processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, a semiconductor wafer (hereinafter, referred to as a "wafer") is subjected to processing such as an etching process and the like. An example of an etching method includes an atomic layer etching (ALE) method. In the ALE method, a chemical modification process that acts only on the outermost atomic layer of a wafer and an etching process of removing only the chemically modified portion are alternately repeated, thereby etching atomic layers of a target film layer by layer.

In an etching apparatus for performing the ALE method, a wafer disposed inside a chamber is processed by a gas supplied from a gas supply device into the chamber. The gas supply device is provided with a flow rate controller configured to control a flow rate of the gas so as to supply the gas at an appropriate flow rate. As the flow rate controller, for example, a pressure-controlled flow rate controller is used.

In the ALE process, in order to perform the above-mentioned chemical modification process and the etching process, switching of gases is repeated, and supply and stop of the gases are performed in a short time. In the following description, a state of supplying a gas may be referred to as "gas ON," and a state of stopping the supply of the gas may be referred to as "gas OFF." In addition, since ON and OFF of the gas is performed in a short time as described above, a ratio of a section in which a gas flow rate increases from zero to a desired flow rate (hereinafter, referred to as "rising") and a section in which the gas flow rate decreases from the desired flow rate to zero (hereinafter, referred to as "falling") increases. Since operations of these rising and falling are not guaranteed by a flow rate controller in many cases, accuracy in controlling the gas flow rate by the flow rate controller is poor, which may cause deterioration of reproducibility of the gas flow rate.

In the ALE process, for example, a board (circuit board) provided in an etching apparatus measures a duration of the gas ON state to collect data. However, since the duration of the gas ON state is short as described above, a communication error rate increases. As a result, the reproducibility of the gas flow rate deteriorates due to the effect of the communication errors.

In addition, since the flow rate controller is in operation, the reproducibility of the gas flow control is not guaranteed. In other words, responsiveness of the flow rate controller cannot follow the rapid ON and OFF of the gas. Even from this point of view, the reproducibility of the gas flow rate is poor.

In the ALE process of performing the ON and OFF of the gas in such a short time, it is necessary to monitor the gas flow rate in real time with high precision during the process. By monitoring the gas flow rate in real time as described above, an abnormal process can be found, and thus the yield of product wafers can be improved.

The technique according to the present disclosure measures a total flow rate of a gas, which is supplied to process a substrate, with high precision. Hereinafter, a plasma processing system and a plasma processing method as a substrate processing system and a substrate processing method according to an embodiment, respectively, will be described with reference to the drawings. In the present specification and the accompanying drawings, elements having substantially the same functional configurations will be denoted by the same reference numerals and redundant explanations will be omitted.

<Plasma Processing System>

First, a plasma processing system according to an embodiment will be described. FIG. 1 is an explanatory view schematically illustrating a configuration of a plasma processing system 1. In the plasma processing system 1, an ALE process is performed on a wafer W as a substrate.

In an embodiment, the plasma processing system 1 includes a plasma processing apparatus 1a and a controller 1b. The plasma processing apparatus 1a includes a plasma processing chamber 10, a gas supply 20, a radio frequency (RF) power supply 30, and an exhaust system 40. In addition, the plasma processing apparatus 1a includes a support 11 and an upper electrode shower head 12. The support 11 is disposed below a plasma processing space 10s in the plasma processing chamber 10. The upper electrode shower head 12 is disposed above the support 11, and may function as a portion of a ceiling of the plasma processing chamber 10.

The support 11 is configured to support the wafer W in the plasma processing space 10s. In an embodiment, the support 11 includes a lower electrode 111, an electrostatic chuck 112, and an edge ring 113. The electrostatic chuck 112 is disposed on the lower electrode 111 and configured to support the wafer W on a top surface thereof. The edge ring 113 is disposed on a top surface of a peripheral edge portion of the lower electrode 111 so as to surround the wafer W. Although not illustrated, in an embodiment, the support 11 may include a temperature adjustment module configured to adjust at least one of the electrostatic chuck 112 and the wafer W to a target temperature. The temperature adjustment module may include a heater, a flow path, or a combination thereof. A temperature adjustment fluid, such as a coolant or a heat transfer gas, flows through the flow path.

The upper electrode shower head 12 is configured to supply one or more processing gases from the gas supply 20 to the plasma processing space 10s. In an embodiment, the upper electrode shower head 12 has a gas inlet 12a as a gas supply port, a gas diffusion chamber 12b, and a plurality of gas outlets 12c. The gas inlet 12a is in communication with the gas supply 20 and the gas diffusion chamber 12b. The plurality of gas outlets 12c is in fluid communication with the gas diffusion chamber 12b and the plasma processing space 10s. In an embodiment, the upper electrode shower head 12 is configured to supply one or more processing gases from the gas inlet 12a to the plasma processing space 10s via the gas diffusion chamber 12b and the plurality of gas outlets 12c.

The gas supply 20 may include one or more gas sources 21, one or more flow rate controllers 22, and one or more gas supply paths 23. In an embodiment, the gas supply 20 is configured to supply one or more processing gases from the respectively corresponding gas sources 21 to the gas inlet 12a via the respectively corresponding flow rate controllers 22 and gas supply paths 23. Each flow rate controller 22 may include, for example, a so-called pressure-controlled flow rate controller configured to control a flow rate by a pressure of the processing gas. In addition, the gas supply 20 may include one or more flow rate modulation devices configured to modulate or pulse the flow rates of one or more processing gases.

The RF power supply 30 is configured to supply RF power, for example, one or more RF signals, to one or more electrodes, such as the lower electrode 111, the upper electrode shower head 12, or both the lower electrode 111 and the upper electrode shower head 12. With this configuration, plasma is generated from the one or more processing gases supplied to the plasma processing space 10s. Therefore, the RF power supply 30 is capable of functioning as at least a part of a plasma generator configured to generate plasma from one or more processing gases in the plasma processing chamber. In an embodiment, the RF power supply 30 includes a first RF power supply 30a and a second RF power supply 30b.

The first RF power supply 30a includes a first RF generator 31a and a first matching circuit 32a. In an embodiment, the first RF power supply 30a is configured to supply a first RF signal from the first RF generator 31a to the upper electrode shower head 12 via the first matching circuit 32a. For example, the first RF signal may have a frequency within a range of 27 MHz to 100 MHz.

The second RF power supply 30b includes a second RF generator 31b and a second matching circuit 32b. In an embodiment, the second RF power supply 30b is configured to supply a second RF signal from the second RF generator 31b to the lower electrode 111 via the second matching circuit 32b. For example, the second RF signal may have a frequency within a range of 400 kHz to 13.56 MHz. Alternatively, a direct current (DC) pulse generator may be used instead of the second RF generator 31b.

In addition, although not illustrated, other embodiments can be considered in the present disclosure. For example, in an alternative embodiment, the RF power supply 30 may be configured to supply a first RF signal from an RF generator to the lower electrode 111, to supply a second RF signal from another RF generator to the lower electrode 111, and to supply a third RF signal to the upper electrode shower head 12 from still another RF generator. In addition, in another alternative embodiment, a DC voltage may be applied to the upper electrode shower head 12.

Further, in various embodiments, amplitudes of one or more RF signals (i.e., the first RF signal, the second RF signal, and the like) may be pulsed or modulated. Amplitude modulation may include pulsing an amplitude of an RF signal between ON and OFF states, or between two or more different ON states.

The exhaust system 40 may be connected to, for example, a gas exhaust port 10e provided in a bottom portion of the plasma processing chamber 10. The exhaust system 40 may include a pressure valve and a vacuum pump. The vacuum pump may include a turbo molecular pump, a rough vacuum pump, or a combination thereof.

In an embodiment, the controller 1b processes computer-executable instructions that cause the plasma processing apparatus 1a to perform various processes described in the present disclosure. The controller 1b may be configured to control individual components of the plasma processing apparatus 1a to perform various processes described herein. In an embodiment, a part or all of the controller 1b may be included in the plasma processing apparatus 1a. The controller 1b may include, for example, a computer 51. The computer 51 may include, for example, a processor (central processing unit (CPU)) 511, a storage 512, and a communication interface 513. The processor 511 may be configured to perform various control operations based on a program stored in the storage 512. The storage 512 may include a random access memory (RAM), a read only memory (ROM), a hard disk drive (HDD), a solid state drive (SSD), or a combination thereof. The communication interface 513 may communicate with the plasma processing apparatus 1a via a communication line such as a local area network (LAN).

<Gas Supply>

Figure 2:
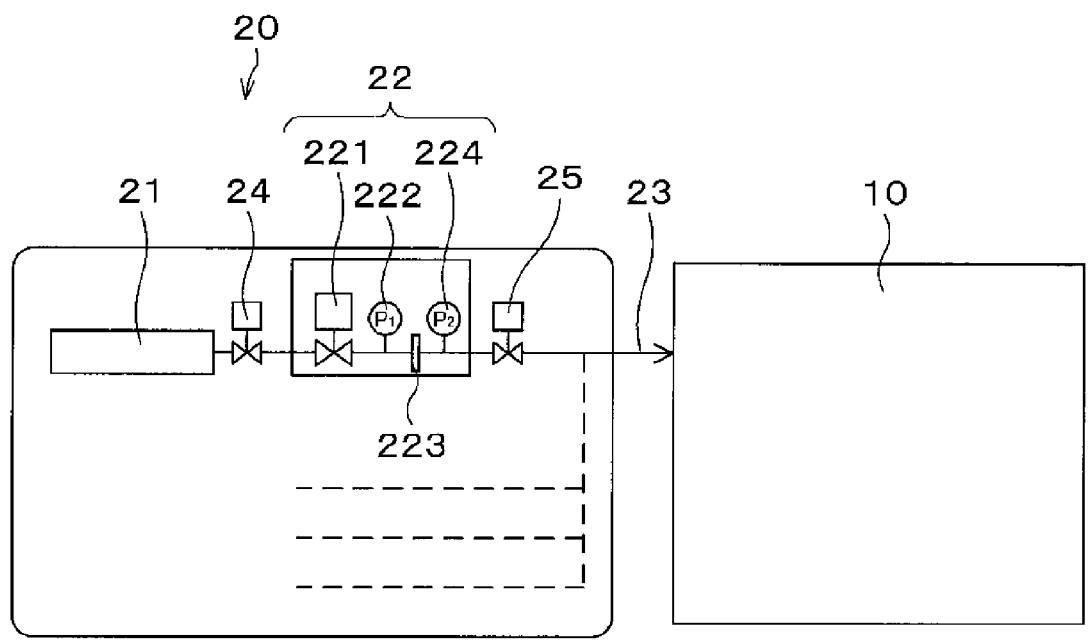
FIG. 2 is an explanatory view schematically illustrating a configuration of a gas supply.

Next, the above-described gas supply 20 will be described. FIG. 2 is an explanatory view schematically illustrating a configuration of the gas supply 20.

As described above, the gas supply 20 includes one or more gas sources 21, one or more flow rate controllers 22, and one or more gas supply paths 23. In addition, the gas supply 20 further includes one or more primary valves 24 and one or more secondary valves 25. In the gas supply path 23, the primary valve 24 is provided between the gas source 21 and the flow rate controller 22, and the secondary valve 25 is disposed on a downstream side of the flow rate controller 22. A set of one gas source 21, one flow rate controller 22, one gas supply path 23, one primary valve 24, and one secondary valve 25 is provided for each type of the processing gas.

Each flow rate controller 22 includes a piezo valve 221, a primary pressure gauge 222, an orifice 223, and a secondary pressure gauge 224. The piezo valve 221, the primary pressure gauge 222, the orifice 223, and the secondary pressure gauge 224 are provided in this order from an upstream side to a downstream side in the gas supply path 23. In the following description, a pressure measured by the primary pressure gauge 222 may be referred to as a primary pressure P1, and a pressure measured by the secondary pressure gauge 224 may be referred to as a secondary pressure P2. The flow rate controller 22 measures a pressure of the processing gas, and converts the pressure value into a flow rate value to control the flow rate of the processing gas.

Although various exemplary embodiments have been described above, the present disclosure is not limited to the exemplary embodiments described above, and various omissions, substitutions, and changes may be made. In addition, elements in different embodiments may be combined to form other embodiments.

<ALE Process>

Next, an ALE process performed using the plasma processing system configured as described above will be described.

(Chemical Modification Process)

For example, $Cl_2$ (chlorine) gas as a processing gas is supplied from the gas supply 20 into the plasma processing chamber 10, adsorbed on a surface of the wafer W (silicon), and modified into a SiCl compound.

(Etching Process)

For example, Ar (argon) gas as a processing gas is supplied from the gas supply 20 into the plasma processing chamber 10 to generate Ar ions. Further, only the SiCl compound on the surface of the wafer W is selectively etched by the Ar ions.

In addition, the chemical modification process and the etching process are alternately repeated to etch atomic layers of a target film layer by layer. Generally known methods are used for the chemical modification process and the etching process.

<Gas Monitoring Method>

As described above, in the ALE process, switching of the processing gas is repeated because the chemical modification process and the etching process are performed, and ON and OFF of the processing gas is performed in a short time. In such an ALE process in which the ON and OFF of the processing gas is performed in a short time, it is necessary to monitor the gas flow rate in real time with high precision during the process.

Figure 3:
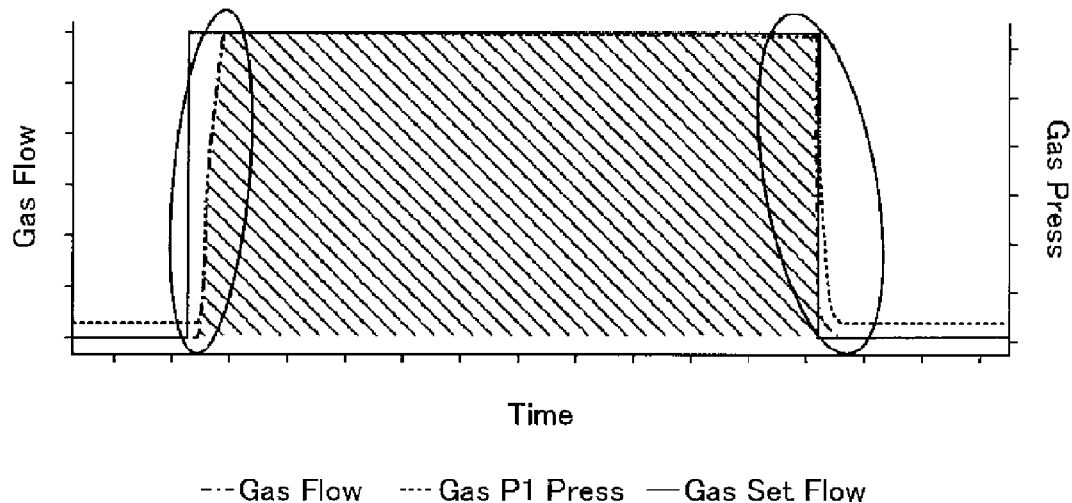
FIG. 3 is an explanatory view illustrating ON and OFF of a processing gas.

Here, the present inventors first conceived a monitoring method by using an output value of a gas flow rate from the flow rate controller 22. FIG. 3 is an explanatory view illustrating ON and OFF of a processing gas. In FIG. 3, "Gas Set Flow" indicates a set value of a flow rate of the processing gas, "Gas Flow" indicates a gas flow rate output from the flow rate controller 22, and "Gas P1 Press" indicates a gas pressure measured by the flow rate controller 22, specifically, the primary pressure P1.

In the example of FIG. 3, a total flow rate of the processing gas is monitored by monitoring an area of "Gas Flow" (hatched portion in FIG. 3). However, in such a case, even when a flow rate of an actually flowing gas is the same, the rising and falling of the gas flow rate (circled portions in FIG. 3) may deviate due to a flow rate conversion in the flow rate controller 22. That is, in the flow rate controller 22, since a pressure value is converted into a flow rate value according to a conversion point or setting of a control method, an output flow rate may not be the same even when an internal pressure value (pressure data) is the same.

Since the operations of the rising and falling of the gas flow rate are not guaranteed by the flow rate controller 22 in many cases, it is desirable to manage individual differences and reproducibility of the flow rate controllers 22 by the plasma processing apparatus 1a or the controller 1b. In addition, it is desirable to detect a case where actual gas flow rates in the flow rate controllers 22 are different (a case where pressure waveforms deviate) without detecting a case where the actual gas flow rates are the same (a case where the pressure waveforms are the same).

Figure 4:
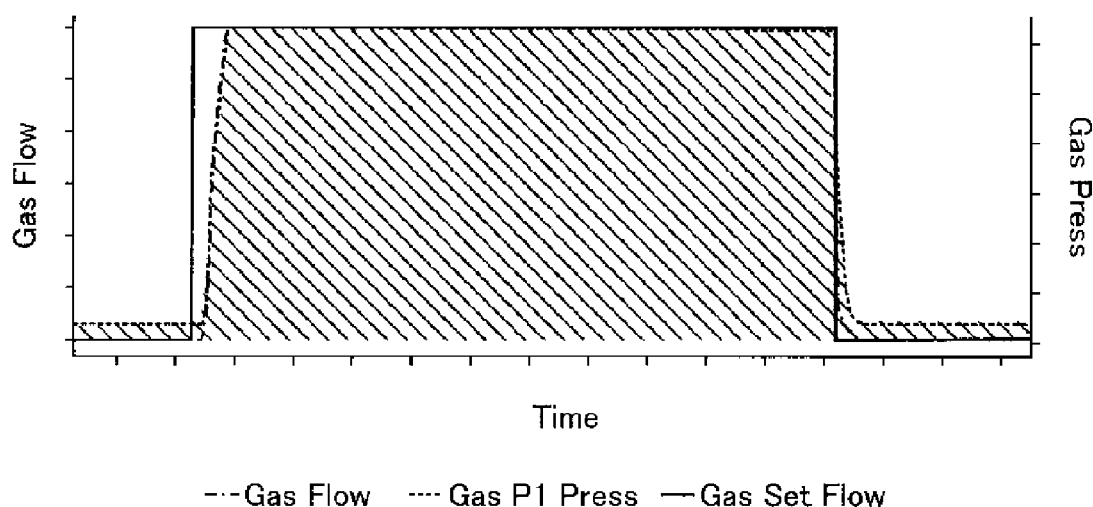
FIG. 4 is an explanatory view illustrating ON and OFF of a processing gas.

Therefore, the present inventors conceived of monitoring the gas flow rate by using a pressure value output from the flow rate controller 22. FIG. 4 is an explanatory view illustrating ON and OFF of a processing gas. In FIG. 4, "Gas Set Flow" indicates a set value of a flow rate of the processing gas, "Gas Flow" indicates a gas flow rate output from the flow rate controller 22, and "Gas P1 Press" indicates a gas pressure measured by the flow rate controller 22, specifically the primary pressure P1.

In the example of FIG. 4, a total flow rate of the processing gas is monitored by monitoring an area of "Gas Flow" (hatched portion in FIG. 4). However, in such a case, since the flow rate controller 22 displays a residual gas pressure even in the gas OFF state, the primary pressure P1 of the processing gas does not become zero. Thus, when the residual gas pressure is large or a duration of the gas OFF state is long, accuracy in the gas flow rate is deteriorated.

In addition, there are individual differences in the flow rate controllers 22 with respect to the primary pressure P1 (a pressure value at a timing when the pressure is stabilized after rising). That is, the primary pressure P1 measured by one flow rate controller 22 and the primary pressure P1 measured by another flow rate controller 22 may be different from each other.

Thus, in the present embodiment, the primary pressure P1 of the processing gas measured in the flow rate controller 22 is converted into a gas flow rate and normalized by using the following Equation (1).

$$F = P1 \times Fs(t)/Ps(t) \qquad (1)$$

F: Normalized gas flow rate (sccm),
P1: Primary pressure in the flow rate controller 22 (psi),
t: Elapsed time (min) from starting the gas supply,
Fs(t): Set value of the gas flow rate (sccm) at time t, and
Ps(t): Primary pressure in the flow rate controller 22 at time t (psi).

In this case, when the flow rates of actually flowing processing gases are the same, each flow rate controller 22 can calculate the same gas flow rate from the above Equation (1). As a result, it is possible to eliminate individual differences in the flow rate controllers 22.

Further, as illustrated in FIG. 4, when data of (gas flow rate)×(time) is integrated in order to calculate the total flow rate of the processing gas in the ALE process, the primary pressure P1 in the flow rate controller 22 does not become zero even in the gas OFF state. Thus, pressure data in the gas OFF state is also converted into a flow rate. Therefore, in the present embodiment, a waveform is extracted only when the processing gas is being supplied (hereinafter, referred to as a "trimming" operation).

Figure 5:
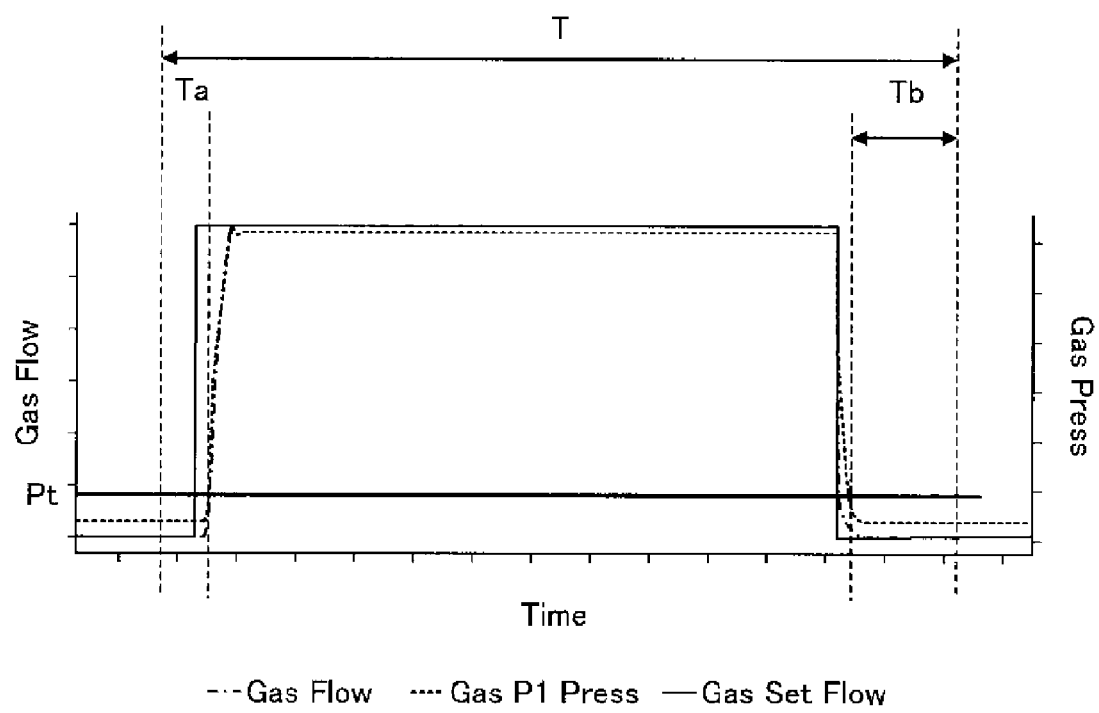
FIG. 5 is an explanatory view schematically illustrating a trimming operation of a gas ON state.

Specifically, as illustrated in FIG. 5, a threshold value Pt of the primary pressure P1 is preset. Regarding the threshold value Pt, for example, when the apparatus is started up, data on the gas flow rate of the flow rate controller 22 and data on the actual gas flow rate are acquired, and the threshold value Pt corresponding to the ALE process is determined. Then, a time T at which the primary pressure P1 becomes equal to or higher than the threshold value Pt is calculated.

The time T may include a front time (first time) Ta before the primary pressure P1 reaches the threshold value Pt during the rising of the primary pressure P1. In addition, the time T may include a rear time (second time) Tb after the primary pressure P1 reaches the threshold value Pt during the falling of the primary pressure P1. Regarding the front time Ta and the rear time Tb, for example, when the apparatus is started up, data on the gas flow rate of the flow rate controller 22 and data on the actual gas flow rate are acquired, and the front time Ta and the rear time Tb corresponding to the ALE process are determined.

In this case, even when the primary pressure P1 of the flow rate controller 22 does not become zero in the gas OFF state, it is possible to eliminate the portion corresponding to the gas OFF state. Therefore, when the primary pressure P1 is converted into a gas flow rate, it is possible to appropriately calculate the flow rate in the gas ON state.

As described above, by normalizing the primary pressure P1 of the flow rate controller 22 by converting the same into a flow rate, and by performing the trimming operation of the gas ON state only, it is possible to calculate the total flow rate of the processing gas with high precision. In addition, by constantly monitoring the gas flow rate supplied in the ALE process in real time, a wafer W in which an abnormality has occurred can be detected early.

Next, a processing gas monitoring method, which is performed using the above-mentioned normalization of the primary pressure P1 and the trimming operation of the gas ON state only, will be described. FIG. 6 is a flowchart illustrating exemplary main processes of a method of monitoring a processing gas.

(Step S1)

In step S1, before an ALE process is performed, a recipe for the ALE process is set. Specifically, the set value Fs(t) of the gas flow rate at a specific elapsed time t from starting a gas supply is set, and accordingly, the flow rate controller 22 outputs the primary pressure Ps(t) that corresponds to the set value Fs(t) of the gas flow rate.

In addition, in step S1, the threshold value Pt of the primary pressure P1 illustrated in FIG. 5 is preset. Further, the front time Ta during the rising of the primary pressure P1 and the rear time Tb during the falling of the primary pressure P1 are also preset. Each of the threshold value Pt, the front time Ta, and the rear time Tb may be set by acquiring data on the gas flow rate of the flow rate controller 22 and data on the actual gas flow rate, for example, when the apparatus is started up.

(Step S2)

When the presetting in step S1 is completed, the ALE process is started for a wafer W placed inside the plasma processing chamber 10. That is, in step S2, supplying the processing gas from the gas supply 20 into the plasma processing chamber 10 is started.

(Step S3)

In step S3, the primary pressure P1 of the processing gas is measured by the flow rate controller 22 while the processing gas is being supplied.

(Step S4)

In step S4, the primary pressure P1 of the processing gas measured by the flow rate controller 22 is converted into a gas flow rate and normalized by using the following Equation (2).

$$F = P1 \times Fs(t)/Ps(t) \qquad (2)$$

F: Normalized gas flow rate (sccm),
P1: Primary pressure in the flow rate controller 22 (psi),
t: Elapsed time (min) from starting the gas supply,
Fs(t): Set value of the gas flow rate (sccm) at time t, and
Ps(t): Primary pressure in the flow rate controller 22 at time t (psi).

(Step S5)

When the ALE process for the wafer W is completed, in step S5, the supply of the processing gas from the gas supply 20 into the plasma processing chamber 10 is stopped.

(Step S6)

In step S6, the time T at which the primary pressure P1 of the processing gas measured in step S3 becomes equal to or higher than the threshold value Pt set in step S1 is calculated. Specifically, as illustrated in FIG. 5, the time T including the front time Ta and the rear time Tb is calculated. In the time T, it is possible to perform the trimming operation by extracting the waveform of the pressure in the gas ON state only.

(Step S7)

In step S7, the gas flow rate F normalized in step S4 is integrated with respect to the time T calculated in step S6, thereby calculating the total flow rate of the processing gas. The total flow rate of the processing gas is a total flow rate of the processing gas supplied from the gas supply 20 to the plasma processing chamber 10 in a single operation of ON and OFF of the gas.

(Step S8)

In step S8, whether or not the total flow rate of the processing gas calculated in step S7 is within a desired range is determined. The desired range is preset according to the recipe of the ALE process before the ALE process is performed. For example, the desired range may be set in step S1 while acquiring the data on the gas flow rate of the flow rate controller 22 and the data on the actual gas flow rate when the apparatus is started up. In addition, for example, the ON and OFF of the gas may be repeatedly performed to calculate an average value of gas flow rates, and the desired range may be set based on the calculated average value.

(Step S9)

When the total flow rate of the processing gas is determined to be within the desired range in step S8, the ALE process is continued in step S9.

(Step S10)

When the total flow rate of the processing gas is determined to be out of the desired range in step S8, the set value Fs(t) of the gas flow rate in the flow rate controller 22 is adjusted through a feedback control in step S10.

By performing steps S1 to S10 described above, the total flow rate of the processing gas is monitored in a single operation of ON and OFF of the gas.

According to the embodiment described above, in step S4, the primary pressure P1 of the flow rate controller 22 is converted into a flow rate and normalized. Therefore, when the flow rates of actually flowing processing gases are the same, each flow rate controller 22 can calculate the same gas flow rate from Equation (2) described above. As a result, it is possible to eliminate individual differences in flow rate controllers 22.

In step S6, it is possible to calculate the time T and to perform the trimming operation by extracting the pressure waveform in the gas ON state only. In other words, even when the primary pressure P1 of the flow rate controller 22 does not become zero in the gas OFF state, it is possible to eliminate the portion corresponding to the gas OFF state. Therefore, when the primary pressure P1 is converted into a gas flow rate, it is possible to appropriately calculate the flow rate in the gas ON state.

In addition, it is possible to execute steps S2 to S7 in real time. Further, it is possible to monitor the total flow rate of the processing gas in real time with high precision, including the rising and falling of the gas flow rate that are not guaranteed by the flow rate controller 22. In particular, when the ON and OFF operation of the gas is performed in a short time, for example, when each of a time period during which the gas flow rate increases from zero to a desired flow rate and a time period during which the gas flow rate decreases from the desired flow rate to zero is equal to or less than three seconds, as in the ALE process, since the effect of the rising and falling of the gas flow rate becomes significant, the gas monitoring method of the present embodiment is useful. In addition, by constantly monitoring the gas flow rate supplied in the ALE process in real time, the wafer W in which an abnormality has occurred can be detected early.

Moreover, in the present embodiment, it is possible to monitor the total flow rate of the processing gas in real time without changing the gas supply path 23. Here, when the gas supply path 23 is changed, responsiveness of the processing gas to the plasma processing chamber 10 is changed. In this respect, in the present embodiment, it is possible to accurately monitor the total flow rate of the processing gas without changing the responsiveness.

In the embodiment described above, a method of monitoring the total flow rate of the processing gas in a single gas ON and OFF operation has been described. In this regard, in the ALE process, since the chemical modification process and the etching process are alternately repeated, the ON and OFF operation of the processing is repeatedly performed, as illustrated in FIG. 7. In addition, the number of the ON and OFF operations of the gas is not limited to the example illustrated in FIG. 7, and may be set arbitrarily.

Accordingly, in step S7, the total gas flow rate in a single operation of ON and OFF of the gas may be calculated by averaging total gas flow rates in multiple number of the operations. In such a case, even when fluctuation in the total gas flow rate calculated in step S7 is large in the respective operations of ON and OFF of the gas, the total gas flow rates may be averaged. Thus, it is possible to improve accuracy in determining the total flow rate of the processing gas in step S8.

In step S10 of the embodiment described above, the set value Fs(t) of the gas flow rate in the flow rate controller 22 is subjected to a feedback control. In this regard, with respect to one wafer W, the determination result of the total gas flow rate in one operation of ON and OFF of the gas may be fed-back to the set value Fs(t) of the gas flow rate in a subsequent operation of ON and OFF of the gas. Alternatively, the determination result of the total gas flow rate with respect to one wafer W may be fed-back to the set value Fs(t) of the gas flow rate with respect to a subsequently-processed wafer W.

Further, in step S10 of the embodiment described above, although the set value Fs(t) of the gas flow rate is subjected to a feedback control, the feedback control may not necessarily be performed. When the total flow rate of the processing gas is determined to be out of the desired range in step S8, for example, the ALE process may be stopped.

In the embodiment described above, both of the conversion and normalization of the primary pressure P1 in step S4 and the trimming operation of the gas ON state in step S6 are performed, but step S4 may be omitted. That is, the trimming operation of the gas ON state may be performed by using the value of the primary pressure P1 itself. Even in such a case, it is possible to appropriately monitor the total flow rate of the processing gas.

The gas supply 20 of the embodiment described above may be provided a board (not illustrated) configured to collect data on the primary pressure P1 measured by the primary pressure gauge 222, data on the secondary pressure P2 measured by the secondary pressure gauge 224, data on the duration of the gas ON state, or the like. The board is, for example, a circuit board specialized for data collection. Here, when the board is provided in the plasma processing chamber 10 as in the related art, the communication error ratio becomes large in order to collect data in the gas supply 20. In this respect, when the gas supply 20 includes such a board, the communication error rate is reduced. Thus, it is possible to further improve the reproducibility of the flow rate controller 22.

In the embodiments described above, a method of monitoring the total flow rate of the processing gas in the ALE process has been described, but the target process is not limited thereto. The gas monitoring method of the present disclosure is applicable to, for example, an atomic layer deposition (ALD) process. As described above, in the gas monitoring method of the present disclosure, it is possible to monitor the total flow rate of the processed gas in real time, including the rising and falling of the gas flow rate. Thus, when the operation of ON and OFF of the gas is performed in a short time as in the ALE process or the ALD process, the gas monitoring method of the present disclosure is useful.

According to the present disclosure, it is possible to monitor the total flow rate of the gas supplied to process the substrate with high precision.

While certain embodiments have been described, these embodiments have been presented by way of example only, and are not intended to limit the scope of the disclosures.

Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method of processing a substrate using a gas supplied to a chamber, the method comprising:
   (a) setting a threshold value of a pressure of the gas, which is a control target in a flow rate controller configured to measure the pressure of the gas supplied to the chamber and control a flow rate of the gas;
   (b) supplying the gas into the chamber;
   (c) measuring the pressure of the gas by the flow rate controller;
   (d) stopping the supply of the gas into the chamber;
   (e) calculating a time when the pressure of the gas measured in (c) becomes equal to or higher than the threshold value; and
   (f) calculating a total flow rate of the gas supplied into the chamber based on the pressure of the gas measured in (c) and the time calculated in (e).

2. The substrate processing method of claim 1, further comprising:
   (g) converting the pressure of the gas measured in (c) into a gas flow rate to calculate a normalized gas flow rate using Equation (1) below:

$$F = P1 \times Fs(t)/Ps(t) \qquad (1)$$

wherein F denotes the normalized gas flow rate, P denotes the pressure of the gas measured in (c), t denotes an elapsed time from a start of the supply of the gas, Fs(t) denotes a set value of the gas flow rate at time t, and Ps(t) denotes a pressure of the gas at time t.

3. The substrate processing method of claim 2, wherein (f) includes calculating the total flow rate of the gas by integrating the gas flow rate normalized in (g) with respect to the time calculated in (e).

4. The substrate processing method of claim 2, further comprising:
   (h) determining whether or not the total flow rate of the gas calculated in (f) is within a target range.

5. The substrate processing method of claim 4, wherein when the total flow rate of the gas calculated in (f) is determined to be within the target range in (h), a substrate processing is continued.

6. The substrate processing method of claim 4, wherein when the total flow rate of the gas calculated in (1) is determined to be out of the target range in (h), the set value of the gas flow rate of the flow rate controller is subjected to a feedback control.

7. The substrate processing method of claim 6, wherein in the feedback control, with respect to one substrate, the determination result of the total gas flow rate in one operation of supply and stop of the gas is fed-back to the set value of the gas flow rate in a subsequent operation of supply and stop of the gas.

8. The substrate processing method of claim 6, wherein in the feedback control, the determination result of the total gas flow rate with respect to one substrate is fed-back to the set value of the gas flow rate with respect to a subsequently-processed substrate.

9. The substrate processing method of claim 4, wherein when the total flow rate of the gas calculated in (f) is determined to be out of the target range in (h), a substrate processing is stopped.

10. The substrate processing method of claim 1, wherein the time calculated in (e) includes a first time before the pressure of the gas measured in (c) reaches the threshold value during a rising of the pressure of the gas, and a second time after the pressure of the gas measured in (c) reaches the threshold value during a falling of the pressure of the gas, and
   wherein the first time and the second time are set in (a).

11. The substrate processing method of claim 10, wherein the first time and the second time are determined based on data on a flow rate of the gas measured by the flow rate controller and data on an actual flow rate of the gas.

12. The substrate processing method of claim 1, wherein (a) to (f) are repeatedly performed for processing the substrate, and an average of total flow rates calculated in (f) in respective repetitions is calculated.

13. The substrate processing method of claim 1, wherein the threshold value is determined based on data on a flow rate of the gas measured by the flow rate controller and data on an actual flow rate of the gas.

14. The substrate processing method of claim 1, wherein each of a time period during which the flow rate of the gas increases from zero to a target flow rate in (b) and a time period during which the flow rate of the gas decreases from the target flow rate to zero in (d) is equal to or less than three seconds.

15. The substrate processing method of claim 1, wherein the substrate is processed by repeatedly performing (b) and (d).

16. The substrate processing method of claim 1, wherein the substrate is processed by at least one of an atomic layer etching (ALE) process or an atomic layer deposition (ALD) process.

* * * * *